United States Patent
Broutin et al.

(10) Patent No.: US 6,516,010 B1
(45) Date of Patent: Feb. 4, 2003

(54) METHOD AND APPARATUS FOR ACTIVE NUMERIC TEMPERATURE COMPENSATION OF AN ETALON IN A WAVELENGTH STABILIZED LASER

(75) Inventors: Scott L. Broutin, Maxatawny Township, PA (US); James K. Plourde, Lehigh, PA (US); John W. Stayt, Jr., Lehigh, PA (US)

(73) Assignee: Agere Systems, Inc., Berkeley Heights, NJ (US)

( * ) Notice: Subject to any disclaimer, the term of this patent is extended or adjusted under 35 U.S.C. 154(b) by 0 days.

(21) Appl. No.: 09/352,827

(22) Filed: Jul. 13, 1999

(51) Int. Cl.$^7$ .............................................. H01S 03/13
(52) U.S. Cl. ............................ 372/29.01; 372/29.011; 372/34
(58) Field of Search .................. 372/29.01, 29.011, 372/34

(56) References Cited

U.S. PATENT DOCUMENTS

| | | |
|---|---|---|
| 4,725,854 A | 2/1988 | Ohtsuka et al. |
| 5,420,877 A | 5/1995 | Sandstrom |
| 5,438,579 A * | 8/1995 | Eda et al. ................ 372/34 |
| 6,134,253 A * | 10/2000 | Munks et al. ............ 372/38 |

FOREIGN PATENT DOCUMENTS

| | | |
|---|---|---|
| EP | 0 512 541 | 11/1992 |
| EP | 0 793 316 | 9/1997 |
| EP | 0 818 857 | 1/1998 |

* cited by examiner

Primary Examiner—Paul Ip
Assistant Examiner—Cornelius H Jackson
(74) Attorney, Agent, or Firm—Dickstein Shapiro Morin & Oshinsky LLP

(57) ABSTRACT

A unique method and apparatus for locking on an absolute wavelength of laser light output by a laser package by actively compensating for a change in the temperature of an etalon optical filter is disclosed. Changes in etalon response characteristics due to temperature changes are compensated for by the addition (or subtraction) of an output voltage offset to the voltage control signal sent to the Thermo-Electric Cooler (TEC) from a controller within the laser package. The voltage offset is calculated by monitoring the etalon temperature. The voltage offset value provides for active compensation of changes in the etalon temperature and effectively "readjusts" the output of the laser as if the etalon temperature itself had been readjusted.

39 Claims, 4 Drawing Sheets

METHOD AND APPARATUS FOR ACTIVE NUMERIC TEMPERATURE COMPENSATION OF AN ETALON IN A WAVELENGTH STABILIZED LASER

BACKGROUND OF THE INVENTION

1. Field of the Invention

The present invention relates generally to tunable lasers and other tunable optical signal sources and more particularly to a method and system for compensating for a temperature induced shift in an etalon's Fabry-Perot output characteristics relative to a channel grid on which the laser wavelength lock is to be maintained.

2. Description of the Related Art

Optical fiber communications systems provide for low loss and very high information carrying capacity. In practice, the bandwidth of optical fiber may be utilized by transmitting many distinct channels simultaneously using different carrier wavelengths. The associated technology is called wavelength division multiplexing (WDM). In a narrow band WDM system, eight, sixteen or more different wavelengths are closely spaced to increase fiber transmission capacity.

The wavelength bandwidth that any individual channel occupies depends on a number of factors, including the impressed information bandwidth, and margins to accommodate carrier frequency drift, carrier frequency uncertainty, and to reduce possible inter-channel cross-talk due to non-ideal filters.

To maximize the number of channels, lasers with stable and precise wavelength control are required to provide narrowly spaced, multiple wavelengths. However, in practice, a laser generates light over rather broad bandwidths referred to as the laser gain curve. The only longituidinal-mode discrimination in conventional Fabry-Perot lasers is provided by the gain spectrum itself. Since the laser cavity is a type of Fabry-Perot interferometer, the energy output over the gain curve is not continuous but occurs at discrete, closely spaced frequencies. The output frequencies are based upon the number of discrete longitudinal modes that are supported by the laser cavity. The longitudinal modes will occur at wavelengths such that an integral number of half wavelengths equals the distance between the mirrors of the resonator in the laser. Laser oscillation can occur only at frequencies where the laser gain curve exceeds the losses in the optical path of the resonator. In practice, the broadened laser gain curve exceeds the cavity losses over a large frequency range, on the order of 8 to 10 GHz. As noted above, there will be a number of discrete, closely spaced modes oscillating within this range.

Various approaches have been used to limit the oscillation of a laser to one of the competing longitudinal modes. One approach is a distributed feedback mechanism. Distributed-feedback (DFB) lasers are the most common type of communications laser. A grating integral to the laser structure limits the output to a single frequency. Another of the most common methods requires the use of a frequency selective external cavity/etalon in combination with such a laser device to detect the output wavelength at which the laser is operating and adjust the laser accordingly bad varying the temperature of the laser, known as temperature tuning. Such a method allows for wavelength locking of a laser even in the event of changing ambient temperature conditions. The external cavity/etalon laser is most commonly applied to gas tube lasers but has also been applied for very narrow line width lasers such as those needed for laser gyro use. There are a number of types of etalons. In its simplest form, an etalon consists of a quartz glass plate with parallel surfaces that is placed in the laser resonator at a non-normal angle. Internal reflections give rise to interference effects which cause the etalon to behave as a frequency selective transmission filter, passing with minimum loss frequencies close to a transmission peak and rejecting by destructive interference other frequencies. In practice, the transmission peak of the etalon is set to coincide with a particular longitudinal mode resulting in single frequency operation of the laser.

There are problems, however, with wavelength stability of a temperature tuned laser for a long duration due to thermal problems. Both the DFB laser and external cavity/etalon lasers need to make the wavelength insensitive to temperature change. Typically, a Thermo-Electric Cooler (TEC) and thermistor inside the laser package is sufficient to stabilize wavelength. However, with current dense wavelength division multiplexing (DWDM), wavelength stabilization to parts per million control may not be possible utilizing conventional methods. For example, a wavelength shift as illustrated in FIG. 1 can occur. As previously noted, temperature tuning of a laser's wavelength is accomplished by varying the laser chip temperature via the control current supplied to the Thermo-Electric Cooler (TEC) that the laser chip is mounted on within the laser package. As shown in FIG. 1, a laser package will tune the laser chip to maintain the desired maximum output power at the desired wavelength ($\lambda$ desired), illustrated by point A. As the laser temperature is changed to maintain this point, it is unavoidable due to the proximity of the etalon to the TEC within the laser package that the temperature of the etalon will also change. As the etalon temperature changes, the index of refraction of the material varies and more strongly, the etalon expands or contracts, changing the effective path lengths within the material and thereby changing the interference effects. As the effective path lengths vary, the response curve of the etalon will also vary. The control system of the laser chip will temperature tune the laser chip based on the varied etalon response curve, causing the wavelength output to vary to a different wavelength ($\lambda$ actual), illustrated by point B. This wavelength shift due to control system error and hysteresis can cause problems in the end system. Since the laser is initially set to deliver, to the end system in which the laser is mounted, a specified power and wavelength output, when the wavelength of the output varies it can cause disruption to the operation of the end-product system and possibly even damage the functionality of the end-product system.

Thus, there exists a need for a method and apparatus for stabilizing and locking on an absolute wavelength of laser light by compensating for a temperature change of the etalon in a temperature tuned laser.

SUMMARY OF THE INVENTION

The present invention provides a unique method and apparatus for locking on an absolute wavelength of laser light by actively compensating for a change in temperature of an etalon optical filter.

In accordance with the present invention, changes in etalon response characteristics due to temperature changes are compensated for by the addition (or subtraction) of an output voltage offset to the voltage control signal sent to the Thermo-Electric Cooler (TEC) within the laser package. These calculations can be performed by conventional analog circuitry or by digital manipulation of analog signals by a micro-controller or similar digital signal processor. The voltage offset is calculated by monitoring the etalon temperature. The voltage offset value provides for active compensation of changes in the etalon temperature and effectively "readjusts" the output of the laser as if the etalon temperature itself had been readjusted back to its initial temperature.

These and other advantages and features of the invention will become apparent from the following detailed description of the invention which is provided in connection with the accompanying drawings.

DETAILED DESCRIPTION

Figure 1:
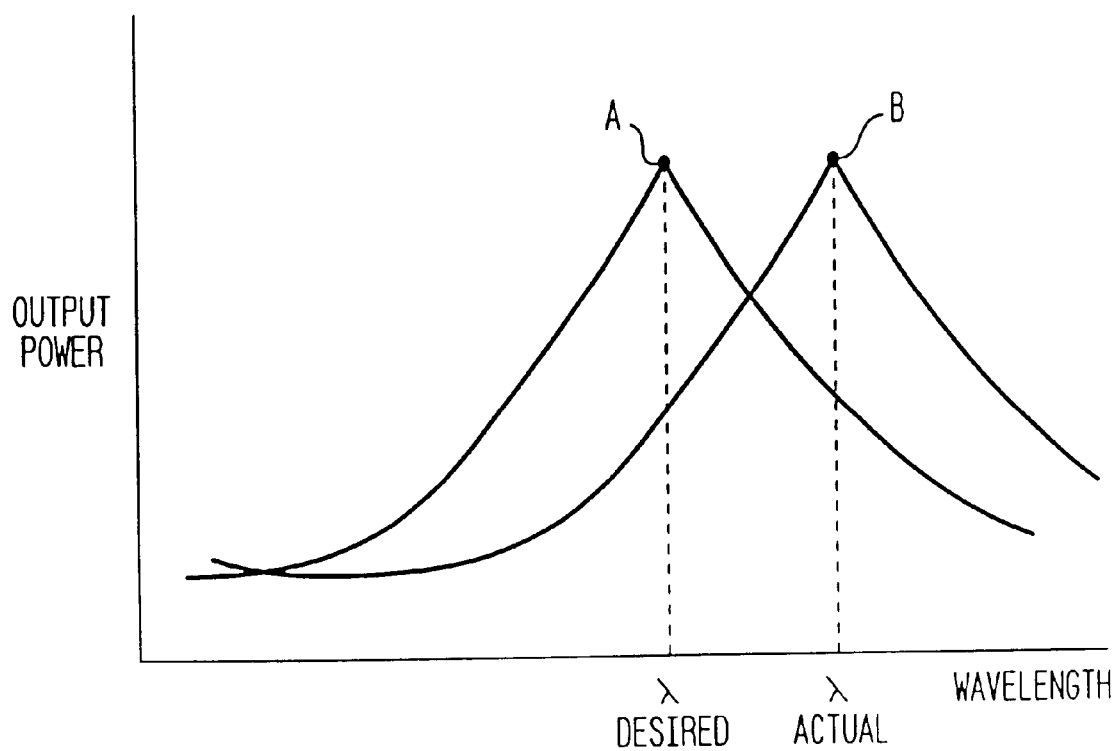
FIG. 1 illustrates the shift in wavelength in response to a change in an etalon response curve due to a temperature change of the etalon within a laser package.
Figure 2:
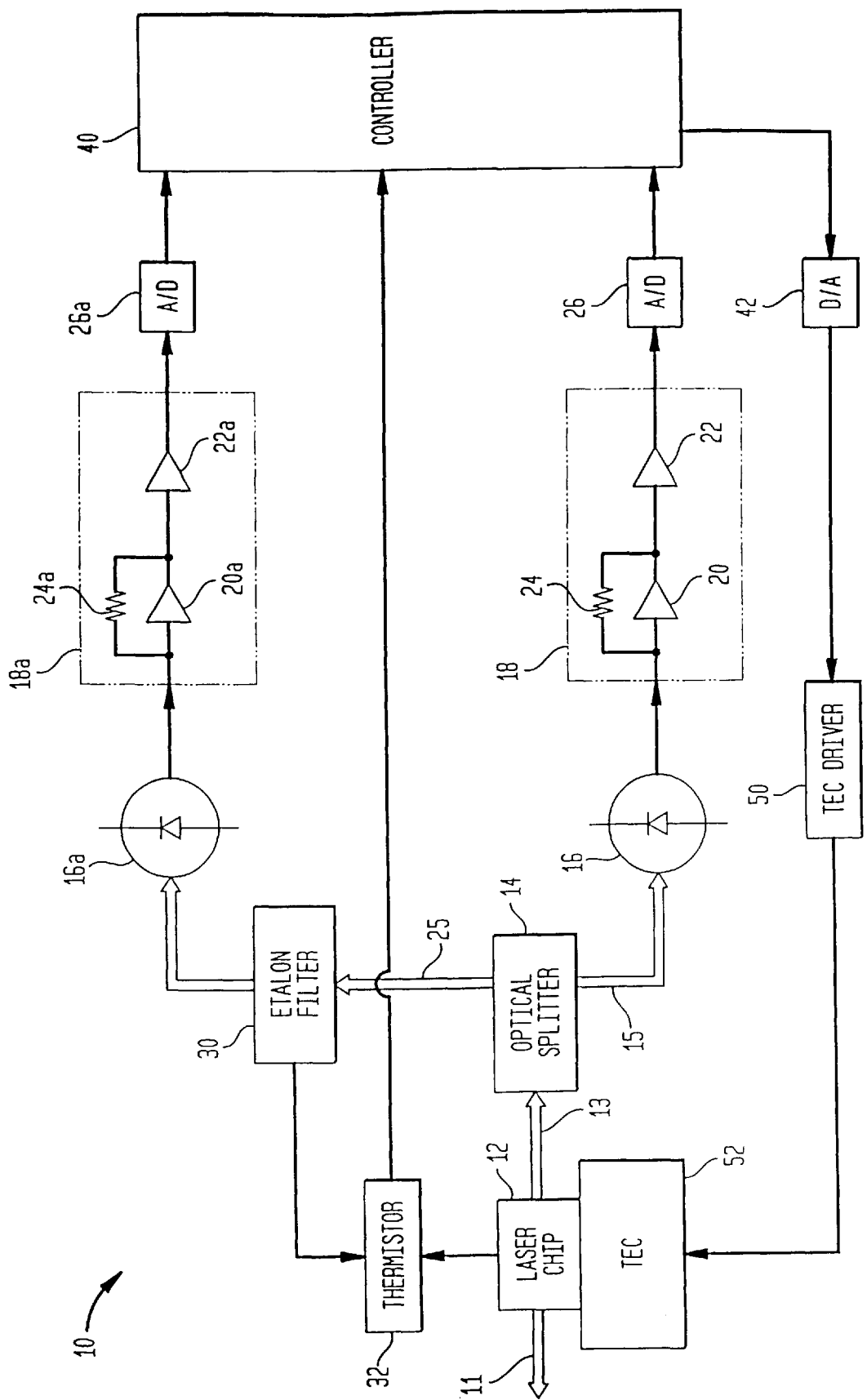
FIG. 2 illustrates in block diagram form a portion of a wavelength stabilized laser control system that can actively compensate for temperature changes in an etalon in accordance with a preferred embodiment of the present invention.

The present invention will be described as set forth in the embodiments illustrated in FIGS. 2–3. Other embodiments may be utilized and structural, logical or programming changes may be made without departing from the spirit or scope of the present invention. Like items are referred to by like reference numerals throughout the description.

In accordance with the present invention, an absolute wavelength of laser light can be locked on by actively compensating for a change in temperature of the etalon optical filter. FIG. 2 illustrates in block diagram form a portion of a typical wavelength stabilized laser system 10. More specifically, FIG. 2 illustrates a control circuit for a temperature tuned laser system 10 that can actively compensate for temperature changes in an etalon in accordance with the present invention.

A laser chip 12 is mounted on a Thermo-Electric Cooler (TEC) 52. A submount (not shown) between the laser chip 12 and the TEC 52 can be used if desired for thermal expansion matching. As is known in the art for temperature tuned lasers, the output of laser chip 12 can be adjusted by modifying the temperature of laser chip 12, as a laser chip will have an output directly related to its operating temperature. Thus, by measuring the output of the laser with respect to a desired output signal, the output of the laser can be adjusted to the desired output level by changing the temperature of the laser chip. The temperature of laser chip 12 can be adjusted by varying the temperature of TEC 52. The temperature of TEC 52 is varied based on an input signal to TEC Driver 50 from a controller 40 through a digital to analog (D/A) converter 42. Controller 40 may include a programmable logic device, one example being a microprocessor. If a microprocessor is used, it may be any conventional general purpose single- or multi-chip microprocessor, or may be any conventional special purpose microprocessor such as a digital signal processor. Analog signal conditioning techniques may also be applied to the A/D and D/A signals.

Controller 40 monitors and controls the output of laser chip 12 as follows. Laser chip 12 generates a laser output 11 and a backface output 13. The output 13 from laser chip 12 is input to an optical splitter 14 to split the output into two separate outputs 15, 25. The first output 15, hereinafter referred to as the reference path, is input to a photodetector 16, as is known in the art, to convert the laser from an optical signal to an electrical signal. The converted electrical signal is input to an amplifier circuit 18, which may include for example operational amplifiers 20, 22 and feedback impedance 24. The output from amplifier circuit 18 is converted from an analog signal to a digital signal by analog to digital (A/D) converter 26 and input to controller 40.

The second output 25, hereinafter referred to as the etalon path, is input to an etalon filter 30 as is known in the art. The output from the etalon filter 30 is input to a second photodetector 16a to convert the laser from an optical signal to an electrical signal. The converted electrical signal is input to an amplifier circuit 18a, which may include for example operational amplifiers 20a, 22a and feedback resistor 24a. The output from amplifier circuit 18a is converted from an analog signal to a digital signal by A/D converter 26a and input to controller 40.

In accordance with the present invention, the temperature of the etalon filter 30 is monitored by a thermistor 32 and input to controller 40. The controller 40 uses the etalon path signal, i.e., the path that passes through the etalon 30, the reference path signal, i.e., the path that is output directly from the laser chip 12 without passing through the etalon filter 30, and the temperature measured by thermistor 32 to monitor the etalon 30 and laser chip 12 (unless a separate thermistor is also included for monitoring the laser chip as described below) to adjust the output 11 of laser chip 12 accordingly by causing TEC driver 50 to vary the temperature of TEC 52.

Figure 3A:
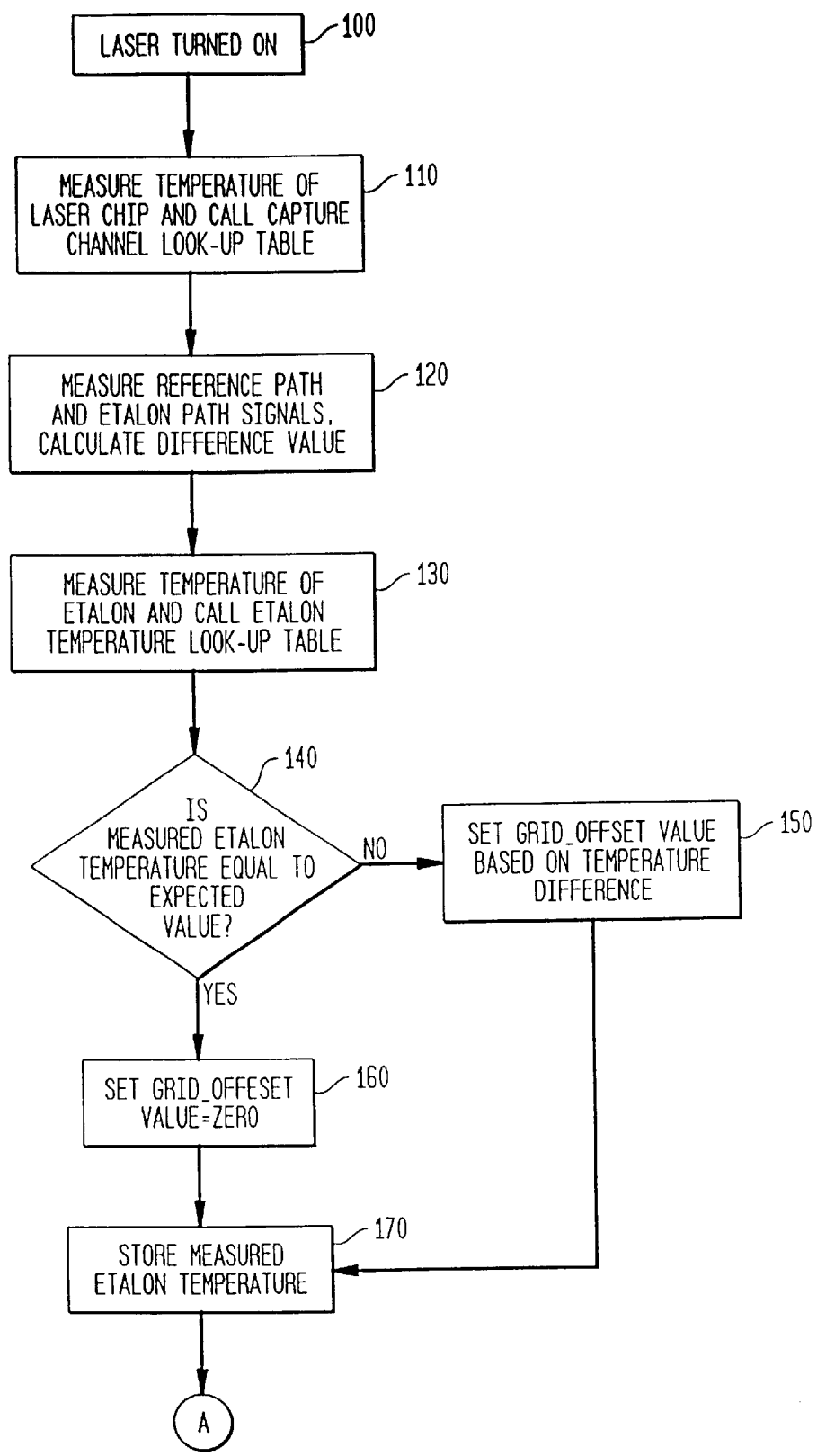
FIGS. 3A and 3B illustrate in flowchart form a method for actively stabilizing a laser wavelength in accordance with the present invention.
Figure 3B:
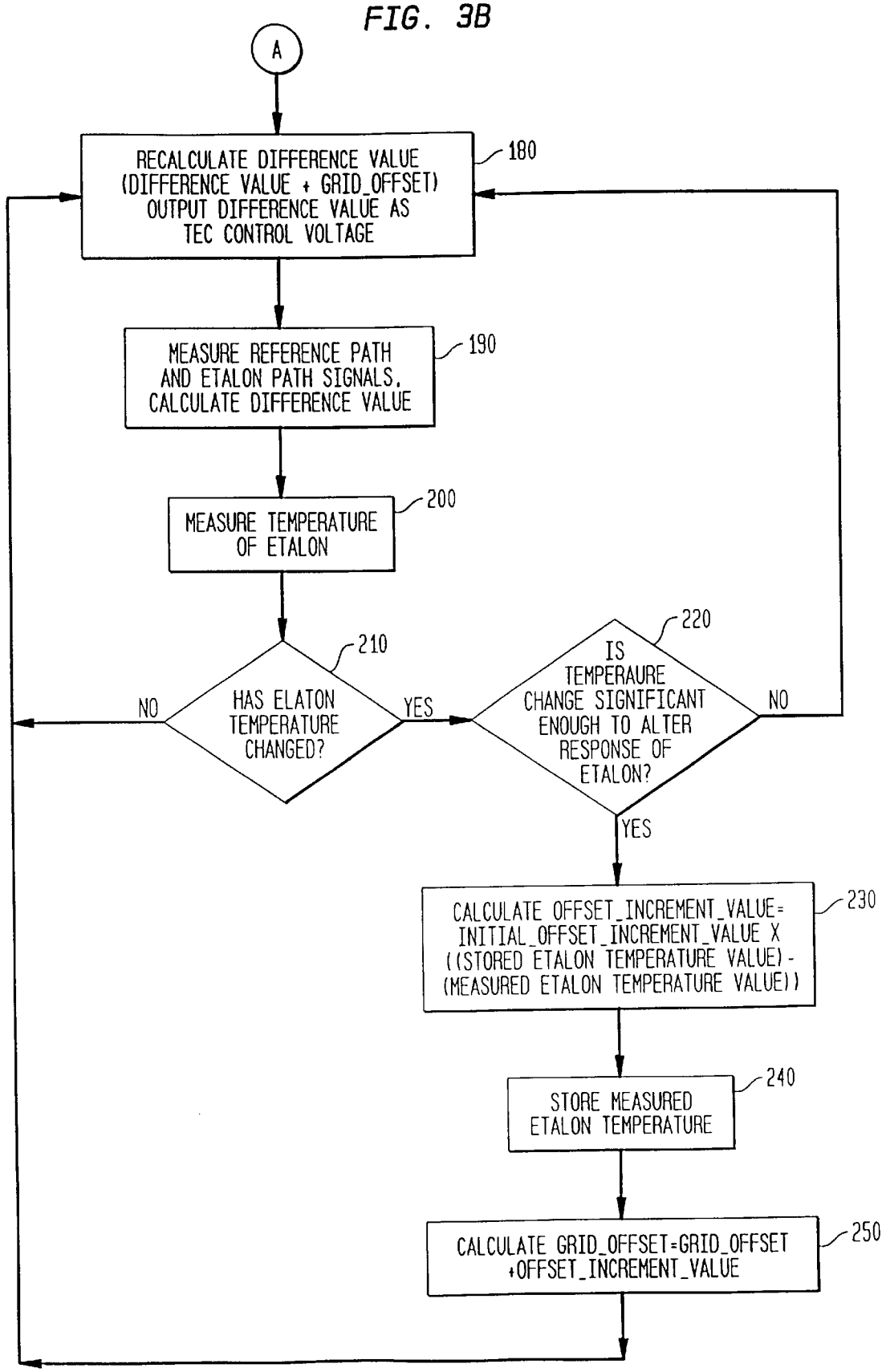

The operation of the circuit of FIG. 2 will be further described with reference to the flowchart of FIGS. 3A and 3B, which illustrate a method for actively stabilizing a laser wavelength in accordance with the present invention. Referring to FIG. 3A, in step 100, the laser chip 12 is turned on. In step 110, the temperature of the laser chip 12 is measured by thermistor 32 and input to controller 40. It should be noted that in some cases, due to the typical packaging of a laser control system such as laser control system 10, the laser chip 12 and etalon filter 30 are in such close proximity to each other that any temperature gradient between them is negligible. Therefore, the temperature of laser chip 12 and etalon filter 30 can be measured utilizing only one thermistor, such as thermistor 32. However, laser chip 12 and etalon filter 30 may be provided with their own thermistor if desired. Once the temperature of the laser chip is determined, an approximate wavelength of the output of the laser chip 12 can be determined, since the output of the laser chip 12 is a function of its temperature. Controller 40 can then reference a look-up table to determine the necessary temperature of the laser chip 12 to output the desired wavelength as predetermined by the end product system requirements. The values in the look-up table are defined during the calibration of laser chip 12 based on the response of laser chip 12 and call be stored, for example, in a memory of controller 40. Based on the temperature value determined from the look-up table, controller 40 will know the required temperature of laser chip 12, determined during calibration, to cause laser chip 12 to provide the desired output.

It should be understood that the wavelength vs. temperature output of laser chip 12 may vary over time as laser chip 12 ages. Thus, as the laser chip 12 ages, the values in the look-up table may no longer be accurate. To overcome this problem, the look-up tables can be supplemented by controller 40, such as for example by a "learning" algorithm, by using historical statistical data to predict and adapt to variations in the laser chip 12 as it ages.

In step 120, the signals from the reference path and the etalon path are measured by controller 40. Controller 40 then subtracts the value of the etalon path signal from the value of the reference path signal and stores this as a Difference Value. It should be noted that compensation for laser aging can be performed in real time based on statistically predicted values for the Difference Value. In step 130, the temperature of the etalon filter is measured by thermistor 32 and stored as an Initial Value. Controller 40 then calls an etalon temperature look-up table to determine the approximate etalon temperature for the desired etalon response curve. As previously noted, the temperature of the etalon determines the expansion of the material, which determines the effective path lengths light travels within the material and changes the interference effects. Thus, during calibration of the etalon filter, it is possible to determine how the etalon will respond at different temperatures to various wavelengths, and an expected value for the given/read temperature of the etalon can be determined. Mathematically derived models that predict this behavior can also be utilized to calculate an expected value.

In step 140, the Initial Value measured in step 130 is compared to the expected value from the look-up table. If the Initial Value is equal to the expected value, then in step 160 a variable called grid_offset is set to zero. If the Initial Value is not equal to the expected value, then in step 150 the value for grid-offset is adjusted accordingly, i.e., adjusted based on the difference between the Initial Value and the expected value obtained from the look-up table. It should be noted that the purpose of steps 140–150 is to allow the system to self-calibrate relative to the values stored in the look-up tables prior to any actual heating/cooling of the laser chip 12 via TEC 52, although it should be noted that laser chip 12 may self-heat at turn-on. Thus, for example, if the laser system 10 is mounted in an end-product system that has an elevated ambient temperature, the laser system 10 can immediately start to compensate for the elevated ambient temperature before any actual heating of the laser chip 12 is performed by TEC 52.

In step 170, the temperature of the etalon as measured by thermistor 32 is stored by controller 40. Referring now to FIG. 3B, in step 180, the Difference Value is recalculated to be the Difference Value+the value of grid_offset, and the new value for the Difference Value is output from controller 40 through D/A converter 42 to TEC driver 50. TEC driver 50, in response to the signal from controller 40, i.e., the value of the adjusted Difference Value, adjusts the temperature of TEC 52, which correspondingly adjusts the output of laser chip 12.

In step 190, the signals from the reference path and the etalon path are again measured by controller 40. Controller 40 then determines a new value for the Difference Value using the same calculation given with respect to step 120 above. In step 200, the temperature of the etalon is again measured by thermistor 32. In step 210, it is determined if the etalon temperature has changed since the previous measurement. If the etalon temperature has not changed, no compensation for a change in etalon temperature is necessary. The method returns to step 180, where a new value for the Difference Value is calculated by adding the value of the Difference Value as calculated in step 190 and the value of grid_offset. The new value calculated for the Difference Value is then output from controller 40 to TEC driver 50 which adjusts the temperature of TEC 52 accordingly.

If the etalon temperature has changed, in step 220 it is determined if the temperature change is significant enough to alter the response properties of the etalon based on the accuracy desired for the system. The higher the accuracy and resolution desired, the lower the value that would represent a significant change. Thus, for example, a temperature change of only 0.5° C. might be considered significant enough in one system, while in other systems a temperature change of at least 1.5° C. is necessary to be considered significant. The value at which a temperature change is considered significant is predetermined and may be stored by controller 40. If the temperature change is not considered significant enough, the method returns to step 180 where a new value for the Difference Value is calculated by adding the value of the Difference Value as calculated in step 190 and the value of grid_offset. The new value for the Difference Value is then output from controller 40 to TEC driver 50 which adjusts the temperature of TEC 52 accordingly.

If it is determined in step 220 that the temperature change is significant enough to alter the properties of the etalon filter 30, in step 230 a value for an offset_increment_value is calculated. The value for offset_increment_value is determined by multiplying an initial_offset_increment_value by the difference of the stored etalon temperature and the most recent measured etalon temperature, i.e., offset_increment_value=initial_offset_increment_value X ((stored etalon temperature)−(measured etalon temperature)). The value of the initial_offset_increment_value is predetermined based on the properties of the material being used for the etalon and its response to temperature changes.

In step 240, the value for the etalon temperature measured in step 200 is stored. In step 250, a new value for grid_offset is determined by adding the value for offset_increment_value determined in step 230 to the previous value for grid_offset. The method returns to step 180, where a new value for Difference Value is calculated with the new value for grid_offset from step 250. The new value for the Difference Value is then output from controller 40 to TEC driver 50 which adjusts the temperature of TEC 52 accordingly.

Thus, in accordance with the present invention, the temperature of the etalon is monitored and the value for grid_offset adjusted based on the temperature change of the etalon. The laser system 10 can then effectively compensate for changes in the etalon response due to a temperature change in the etalon by using the value obtained for grid_offset in the calculation of the Difference Value which is used to control the TEC 52. By compensating for the temperature change in the etalon, laser system 10 can effectively lock on to an absolute wavelength of laser light.

While the invention has been described as being implemented with a laser chip 12, it is to be understood that the invention is not so limited and may be used with any type of laser source as is known in the art, such as for example an array of lasers, a DFB laser, a distributed Bragg reflector (DBR) laser, a Fabry-Perot laser, etc. Additionally, the invention may be used with all temperature sensitive/wavelength sensitive elements, such as for example etalons, interference filters (lowpass, bandpass, and highpass), multiple grouping of filters (bandnotch), gratings, and the like.

Reference has been made to embodiments in describing the invention. However, additions, deletions, substitutions, or other modifications which would fall within the scope of the invention defined in the claims may be implemented by those skilled in the art and familiar with the disclosure of the invention without departing from the spirit or scope of the invention. Also, although the invention is described as implemented by a programmable controller, preferably a microprocessor running a software program, it may be implemented in hardware, software, or any combination of the two. All are deemed equivalent with respect to the operation of the invention. Accordingly, the invention is not to be considered as limited by the foregoing description, but is only limited by the scope of the appended claims.

What is claimed as new and desired to be protected by Letters Patent of the United States is:

1. A laser device comprising:
   a laser source for producing a laser beam;
   an optical filter through which said laser beam passes;
   a temperature device for controlling the temperature of said laser source, said temperature device adapted to vary a temperature of said laser source to adjust an output from said laser source; and
   a controller adapted to output a control signal to said temperature device, said temperature device in response to said control signal varying said temperature of said laser source, said controller further adapted to adjust said control signal in response to a signal from a thermal sensor, said sensor adapted to sense a temperature change of said optical filter.

2. The laser device according to claim 1, wherein said controller is further adapted to determine a difference between a predetermined output from said laser source and said laser beam after passing through said optical filter, wherein said control signal is adjusted based on said difference.

3. The laser device according to claim 1, wherein said laser source is a laser chip.

4. The laser device according to claim 1, wherein said temperature device is a heater.

5. The laser device according to claim 1, wherein said temperature device is a cooler.

6. The laser device according to claim 1, wherein said temperature device is a thermoelectric cooler (TEC).

7. The laser device according to claim 1, further comprising:
   a driver which receives said control signal from said controller and in response outputs a signal which varies said temperature of said laser source.

8. The laser device according to claim 1, further comprising:
   a thermistor adapted to measure said temperature of said optical filter.

9. The laser device according to claim 8, wherein said thermistor is further adapted to measure said temperature of said laser source.

10. The laser device according to claim 8, further comprising:
    an optical splitter to divide said laser beam into a first path and a second path, wherein said controller is adapted to determine a difference between said first and second path, said control signal being adjusted based on said difference.

11. The laser device according to claim 10, wherein said first path further comprises:
    a first photodetector to convert said laser beam of said first path to a first electrical signal; and
    a first analog to digital converter to convert said first electrical signal to a first digital signal, said first digital signal being input to said controller.

12. The laser device according to claim 11, further comprising:
    an amplifier circuit to amplify said first electrical signal.

13. The laser device according to claim 11, wherein said second path further comprises:
    said optical filter through which said laser beam of said second path passes;
    a second photodetector to convert said laser beam of said second path to a second electrical signal; and
    a second analog to digital converter to convert said second electrical signal to a second digital signal, said second digital signal being input to said controller.

14. The laser device according to claim 13, further comprising:
    an amplifier circuit to amplify said second electrical signal.

15. The laser device according to claim 13, wherein said control signal is determined based on said first digital signal, said second digital signal, and a temperature of said optical filter.

16. The laser device according to claim 15, further comprising:
    a digital to analog converter connected between said controller and said driver to convert said control signal from said controller to an analog control signal.

17. The laser device according to claim 1, wherein said optical filter is an etalon.

18. The laser device according to claim 17, wherein said etalon is a quartz glass plate.

19. The laser device according to claim 1, wherein said controller includes a processor.

20. The laser device according to claim 19, wherein said processor includes a microprocessor.

21. A laser control system comprising:
    a laser chip for producing a laser beam;
    an etalon through which said laser beam passes;
    a temperature device on which said laser chip is mounted, said temperature device adapted to vary a temperature of said laser chip to adjust an output from said laser chip; and
    a controller adapted to output a control signal to said temperature device, said temperature device in response to said control signal varying said temperature of said laser chip, said controller further adapted to adjust said control signal in response to a signal from a thermal sensor, said sensor adapted to sense a temperature change of said etalon.

22. The laser control system according to claim 21, wherein said temperature device is a thermo-electric cooler (TEC).

23. The laser control system according to claim 21, wherein said temperature device is a heater.

24. The laser control system according to claim 21, wherein said temperature device is a cooler.

25. The laser control system according to claim 21, further comprising:
    a driver which receives said control signal from said controller and in response outputs a signal which varies said temperature of said laser chip.

26. The laser control system according to claim 25, further comprising:
    a thermistor adapted to measure said temperature of said etalon.

27. The laser control system according to claim 26, further comprising:
    an optical splitter to divide said laser beam into a first path and a second path, wherein said controller is adapted to determine a difference between said first and second path, said control signal being adjusted based on said difference.

28. The laser control system according to claim 27, wherein said first path further comprises:
a first photodetector to convert said laser beam of said first path to a first electrical signal; and
a first analog to digital converter to convert said first electrical signal to a first digital signal, said first digital signal being input to said controller.

29. The laser control system according to claim 28, further comprising:
an amplifier circuit to amplify said first electrical signal.

30. The laser control system according to claim 28, wherein said second path further comprises:
said etalon through which said laser beam of said second path passes;
a second photodetector to convert said laser beam of said second path to a second electrical signal; and
a second analog to digital converter to convert said second electrical signal to a second digital signal, said second digital signal being input to said controller.

31. The laser control system according to claim 30, further comprising:
an amplifier circuit to amplify said second electrical signal.

32. The laser control system according to claim 30, wherein said control signal is determined based on said first digital signal, said second digital signal, and a temperature of said etalon.

33. The laser control system according to claim 32, further comprising:
a digital to analog converter connected between said controller and said driver to convert said control signal from said controller to an analog control signal.

34. A laser device comprising:
a laser source for producing a laser beam;
an optical filter through which said laser beam passes;
a temperature sensor for sensing a temperature of said optical filter;
a temperature device for controlling a temperature of said laser source, said temperature device adapted to vary said temperature of said laser source to adjust an output from said laser source; and
a controller adapted to output a control signal to said temperature device, said temperature device in response to said control signal varying said temperature of said laser source, said controller further adapted to adjust said control signal in response to a signal from said temperature sensor.

35. A laser control system comprising:
a laser chip for producing a laser beam;
an etalon through which said laser beam passes;
a temperature sensor adapted to sense a temperature of said etalon and produce a sensor signal;
a temperature device on which said laser chip is disposed, said temperature device adapted to vary a temperature of said laser chip to adjust an output from said laser chip; and
a controller adapted receive said sensor signal and to output a control signal to said temperature device, said temperature device in response to said control signal varying said temperature of said laser chip, said controller further adapted to adjust said control signal in response to said sensor signal.

36. A laser device as defined in claim 1, wherein said sensor adapted to sense a temperature change is disposed in contact with said optical filter.

37. A laser control system as defined in claim 21, wherein said sensor adapted to sense a temperature change is disposed in contact with said etalon.

38. A laser system comprising:
a laser source for producing a laser beam;
an optical filter through which said laser beam passes;
a temperature sensor positioned outside of said laser beam;
a temperature device for controlling the temperature of said laser source, said temperature device adapted to vary a temperature of said laser source to adjust an output from said laser source; and
a controller adapted to output a control signal to said temperature device, said temperature device in response to said control signal varying said temperature of said laser source, said controller further adapted to adjust said control signal in response to a temperature change of said optical filter, wherein said temperature change of said optical filter is sensed by said sensor.

39. A laser control system as defined in claim 38 wherein said optical filter further comprises an etalon.

* * * * *